(12) United States Patent
Kawaguchi et al.

(10) Patent No.: US 7,655,571 B2
(45) Date of Patent: Feb. 2, 2010

(54) INTEGRATED METHOD AND APPARATUS FOR EFFICIENT REMOVAL OF HALOGEN RESIDUES FROM ETCHED SUBSTRATES

(75) Inventors: Mark Naoshi Kawaguchi, Sunnyvale, CA (US); Kin Pong Lo, Fremont, CA (US); Brett Christian Hoogensen, Los Gatos, CA (US); Sandy M. Wen, San Jose, CA (US); Steven M. Kim, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 4 days.

(21) Appl. No.: 11/553,132

(22) Filed: Oct. 26, 2006

(65) Prior Publication Data

US 2008/0102646 A1 May 1, 2008

(51) Int. Cl.
*H01L 21/302* (2006.01)
(52) U.S. Cl. .................... 438/706; 438/714; 216/67
(58) Field of Classification Search ............... 438/706, 438/710, 714, 723, 724; 216/67, 74, 79
See application file for complete search history.

(56) References Cited

U.S. PATENT DOCUMENTS

| | | | | |
|---|---|---|---|---|
| 4,952,299 A | * | 8/1990 | Chrisos et al. ......... | 204/298.25 |
| 5,071,714 A | | 12/1991 | Rodbell et al. | |
| 5,188,979 A | | 2/1993 | Filipiak | |
| 5,217,501 A | * | 6/1993 | Fuse et al. .............. | 29/25.01 |
| 5,337,207 A | | 8/1994 | Jones et al. | |
| 5,356,833 A | | 10/1994 | Maniar et al. | |
| 5,641,702 A | | 6/1997 | Imai et al. | |
| 5,840,200 A | | 11/1998 | Nakagawa et al. | |
| 6,000,227 A | * | 12/1999 | Kroeker .................. | 62/62 |
| 6,136,211 A | | 10/2000 | Qian et al. | |
| 6,184,072 B1 | | 2/2001 | Kaushik et al. | |
| 6,204,141 B1 | | 3/2001 | Lou | |
| 6,228,739 B1 | | 5/2001 | Ha et al. | |
| 6,270,568 B1 | | 8/2001 | Droopad et al. | |
| 6,270,582 B1 | * | 8/2001 | Rivkin et al. ............ | 118/719 |
| 6,297,095 B1 | | 10/2001 | Muralidhar et al. | |
| 6,300,202 B1 | | 10/2001 | Hobbs et al. | |
| 6,300,212 B1 | | 10/2001 | Inoue et al. | |

(Continued)

FOREIGN PATENT DOCUMENTS

JP          05-356477          12/1993

OTHER PUBLICATIONS

Visokay, et al. "Application of HfSiON as a Gate Dielectric Material", Applied Physic Letters, 80 (17), 3183-3185 (Mar. 2002).

(Continued)

*Primary Examiner*—Kin-Chan Chen
(74) *Attorney, Agent, or Firm*—Patterson & Sheridan, LLP

(57) ABSTRACT

A method and apparatus for removing volatile residues from a substrate are provided. In one embodiment, a method for volatile residues from a substrate includes providing a processing system having a load lock chamber and at least one processing chamber coupled to a transfer chamber, treating a substrate in the processing chamber with a chemistry comprising halogen, and removing volatile residues from the treated substrate in the load lock chamber.

26 Claims, 5 Drawing Sheets

U.S. PATENT DOCUMENTS

| | | | |
|---|---|---|---|
| 6,319,730 B1 | 11/2001 | Ramdani et al. | |
| 6,326,261 B1 | 12/2001 | Tsang et al. | |
| 6,335,207 B1 | 1/2002 | Joo et al. | |
| 6,348,386 B1 | 2/2002 | Gilmer | |
| 6,458,253 B2 * | 10/2002 | Ando et al. | 204/192.15 |
| 6,485,988 B2 * | 11/2002 | Ma et al. | 438/3 |
| 6,635,185 B2 * | 10/2003 | Demmin et al. | 216/64 |
| 2001/0055852 A1 | 12/2001 | Moise et al. | |
| 2002/0074312 A1 | 6/2002 | Ou-Yang et al. | |
| 2003/0170986 A1 | 9/2003 | Nallan et al. | |
| 2004/0002223 A1 | 1/2004 | Nallan et al. | |
| 2004/0007561 A1 | 1/2004 | Nallan et al. | |
| 2004/0043544 A1 * | 3/2004 | Asai et al. | 438/149 |
| 2004/0203251 A1 * | 10/2004 | Kawaguchi et al. | 438/727 |

OTHER PUBLICATIONS

Yee, et al. "Reactive Radio Frequency Sputter Deposition of Higher Nitrides of Titanium, Zirconium and Hafnium," J. Vac. Sci. Technol A 4(3) May/Jun. 1986, 381-387.

Translation of Official Letter for Korean Patent Application No. 10-2007-0107670 dated Dec. 17, 2008.

Notice of final rejection from the Korean Intellectual Property Office dated, May 26, 2009, for corresponding Korean Patent Application No. 10-2007-0107670. A Concise Statement of Relevance is provided.

Official Letter from Chinese Patent Office, 2007101653397 dated Feb. 27, 2009.

* cited by examiner

INTEGRATED METHOD AND APPARATUS FOR EFFICIENT REMOVAL OF HALOGEN RESIDUES FROM ETCHED SUBSTRATES

BACKGROUND OF THE INVENTION

1. Field of the Invention

The present invention generally relates to a method and apparatus for fabricating devices on a semiconductor substrate. More specifically, the present invention relates to a method and apparatus for removing halogen-containing residues after plasma etching a layer on a semiconductor substrate.

2. Description of the Related Art

Ultra-large-scale integrated (ULSI) circuits may include more than one million electronic devices (e.g., transistors) that are formed on a semiconductor substrate, such as a silicon (Si) substrate, and cooperate to perform various functions within the device. Typically, the transistors used in the ULSI circuits are complementary metal-oxide-semiconductor (CMOS) field effect transistors. A CMOS transistor has a gate structure comprising a polysilicon gate electrode and gate dielectric, and is disposed between a source region and drain regions that are formed in the substrate.

Plasma etching is commonly used in the fabrication of transistors and other electronic devices. During plasma etch processes used to form transistor structures, one or more layers of a film stack (e.g., layers of silicon, polysilicon, hafnium dioxide ($HfO_2$), silicon dioxide ($SiO_2$), metal materials, and the like) are typically exposed to etchants comprising at least one halogen-containing gas, such as hydrogen bromide (HBr), chlorine ($Cl_2$), carbon tetrafluoride ($CF_4$), and the like. Such processes cause a halogen-containing residue to build up on the surfaces of the etched features, etch masks, and elsewhere on the substrate.

When exposed to a non-vacuumed environment (e.g., within factory interfaces or substrate storage cassettes) and/or during consecutive processing, gaseous halogens and halogen-based reactants (e.g., bromine ($Br_2$), chlorine($Cl_2$), hydrogen chloride (HCl), and the like) may be released from the halogen-containing residues deposited during etching. The released halogens and halogen-based reactants create particle contamination and cause corrosion of the interior of the processing systems and factory interfaces, as well as corrosion of exposed portions of metallic layers on the substrate. Cleaning of the processing systems and factory interfaces and replacement of the corroded parts is a time consuming and expensive procedure.

Several processes have been developed to remove the halogen-containing residues on the etched substrates. For example, the etched substrate may be transferred into a remote plasma reactor to expose the etched substrate to a gas mixture that converts the halogen-containing residues to non-corrosive volatile compounds that may be out-gassed and pumped out of the reactor. However, such process requires a dedicated process chamber along with an additional step, causing increased tool expense, reduced manufacturing productivity and throughput, resulting in high manufacturing cost.

Therefore, there is a need for an improved method and apparatus for removing halogen-containing residues from a substrate.

SUMMARY OF THE INVENTION

A method and apparatus for removing volatile residues on an etched substrate are provided. In one embodiment, a method for removing volatile residues from a substrate includes providing a processing system having a load lock chamber and at least one processing chamber coupled to a transfer chamber, treating a substrate in the processing chamber with a chemistry comprising halogen, and removing volatile residues from the treated substrate in the load lock chamber.

In another embodiment, a method for removing halogen-containing residues from a substrate includes providing a processing system having a load lock chamber and at least one processing chamber coupled to a transfer chamber, treating a substrate in the processing chamber with chemistry comprising halogen, removing halogen-containing residues from the substrate in the load lock chamber, and subsequently cooling the substrate in the load lock chamber.

In yet another embodiment, an apparatus suitable for removing halogen-containing residues from a substrate includes at least one etch chamber, a load lock chamber interfaced with a heat module that is adapted to heat a substrate disposed in the load lock chamber, a transfer chamber having a robot disposed therein that is adapted to transfer the substrate between the etch chamber and the load lock chamber, a remote plasma source coupled to the load lock chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention provides a method and apparatus for removing halogen-containing residues from a substrate etched using an etchant that includes halogen. In one embodiment, the halogen-containing residues deposited during substrate etching are removed by a thermal treatment process performed in a load lock chamber integrated within a processing system. The load lock chamber heats the etched substrate and converts the halogen-containing residues into non-volatile compounds which may be pumped out of the load lock chamber. By performing the halogen-containing residue removal process in the load lock chamber during the substrate transfer sequence through the load lock chamber, the residue is removed without adversely increasing the overall process cycle time. The invention substantially prevents the environment of the processing system and the substrate from contamination and corrosion while maintaining high productivity and process throughput.

Figure 1:
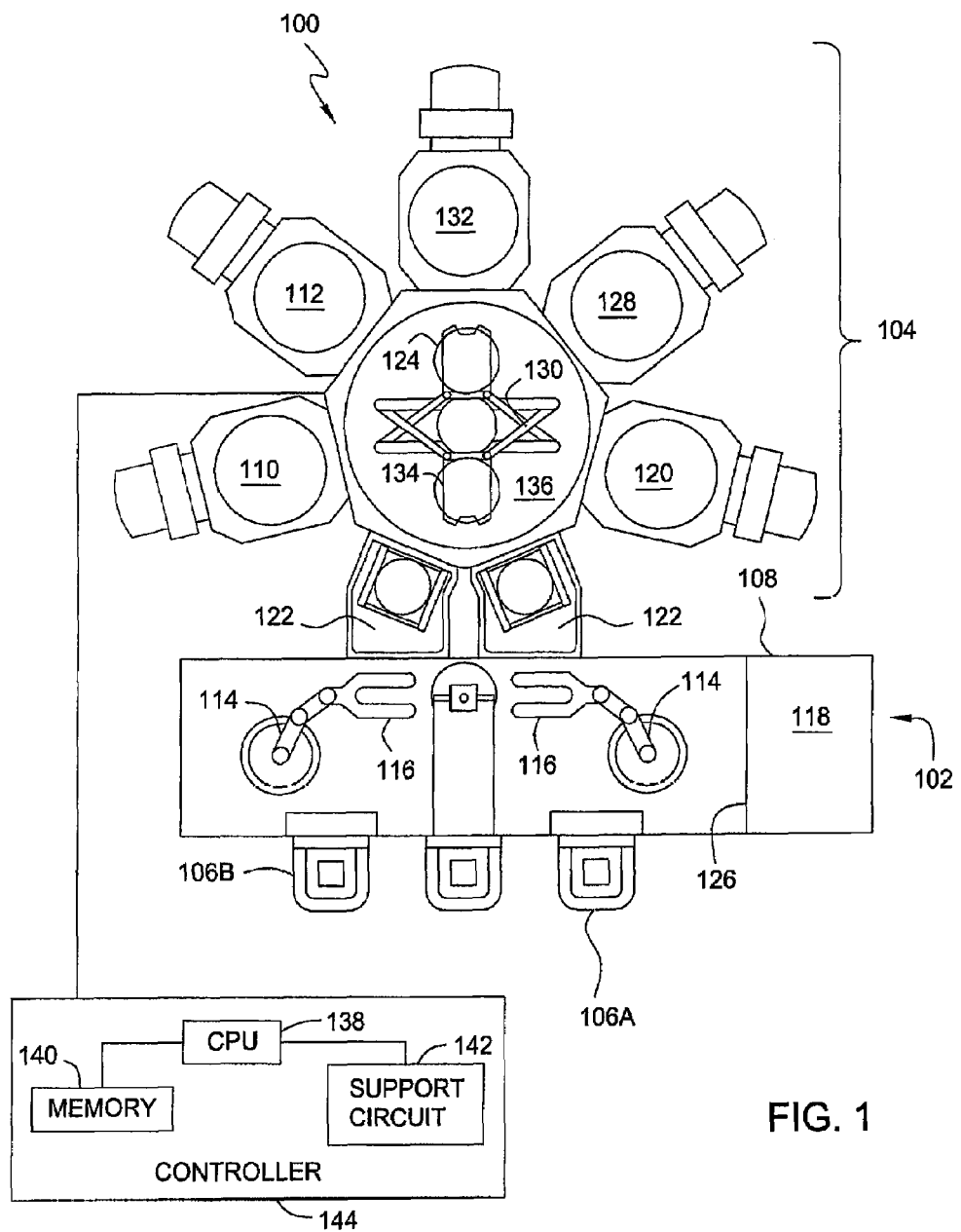
FIG. 1 depicts a schematic diagram of an exemplary processing apparatus that includes one embodiment of a load lock chamber suitable for practice the present invention.

FIG. 1 is a schematic, top plan view of an exemplary processing system 100 that includes one embodiment of a load lock chamber 122 suitable for practicing the present invention. In one embodiment, the processing system 100 may be a CENTURA® integrated processing system, commercially available from Applied Materials, Inc., located in Santa Clara, Calif. It is contemplated that other processing systems (including those from other manufacturers) may be adapted to benefit from the invention.

The system 100 includes a vacuum-tight processing platform 104, a factory interface 102, and a system controller 144. The platform 104 includes a plurality of processing chambers 110, 112, 132, 128, 120 and at least one load-lock chamber 122 that are coupled to a vacuum substrate transfer chamber 136. Two load lock chambers 122 are shown in FIG. 1. The factory interface 102 is coupled to the transfer chamber 136 by the load lock chambers 122.

In one embodiment, the factory interface 102 comprises at least one docking station 108 and at least one factory interface robot 114 to facilitate transfer of substrates. The docking station 108 is configured to accept one or more front opening unified pod (FOUP). Two FOUPS 106A-B are shown in the embodiment of FIG. 1. The factory interface robot 114 having a blade 116 disposed on one end of the robot 114 is configured to transfer the substrate from the factory interface 102 to the processing platform 104 for processing through the load lock chambers 122. Optionally, one or more metrology stations 118 may be connected to a terminal 126 of the factory interface 102 to facilitate measurement of the substrate from the FOUPS 106A-B.

Each of the load lock chambers 122 have a first port coupled to the factory interface 102 and a second port coupled to the transfer chamber 136. The load lock chambers 122 are coupled to a pressure control system (not shown) which pumps down and vents the load lock chambers 122 to facilitate passing the substrate between the vacuum environment of the transfer chamber 136 and the substantially ambient (e.g., atmospheric) environment of the factory interface 102.

The transfer chamber 136 has a vacuum robot 130 disposed therein. The vacuum robot 130 has a blade 134 capable of transferring substrates 124 between the load lock chambers 122 and the processing chambers 110, 112, 132, 128, 120.

In one embodiment, at least one process chambers 110, 112, 132, 128, 120 is an etch chamber. For example, the etch chamber may be a Decoupled Plasma Source (DPS) chamber available from Applied Materials, Inc. The DPS etch chamber uses an inductive source to produce high-density plasma and comprises a source of radio-frequency (RF) power to bias the substrate. Alternatively, at least one of the process chambers 110, 112, 132, 128, 120 may be one of a HART™, E-MAX®, DPS®, DPS II, PRODUCER E, or ENABLER® etch chamber also available from Applied Materials, Inc. Other etch chambers, including those from other manufacturers, may be utilized. The etch chambers, for example, chambers 110, 112, 132, 128, 120 may use a halogen-containing gas to etch the substrate 124 therein. Examples of halogen-containing gas include hydrogen bromide (HBr), chlorine ($Cl_2$), carbon tetrafluoride ($CF_4$), and the like. After etching the substrate 124, halogen-containing residues may be left on the substrate surface. The halogen-containing residues may be removed by a thermal treatment process in the load lock chambers 122, as will be further discussed below.

The system controller 144 is coupled to the processing system 100. The system controller 144 controls the operation of the system 100 using a direct control of the process chambers 110, 112, 132, 128, 120 of the system 100 or alternatively, by controlling the computers (or controllers) associated with the process chambers 110, 112, 132, 128,120 and the system 100. In operation, the system controller 144 enables data collection and feedback from the respective chambers and system controller 144 to optimize performance of the system 100.

The system controller 144 generally includes a central processing unit (CPU) 138, a memory 140, and support circuit 142. The CPU 138 may be one of any form of a general purpose computer processor that can be used in an industrial setting. The support circuits 142 are conventionally coupled to the CPU 138 and may comprise cache, clock circuits, input/output subsystems, power supplies, and the like. The software routines, such as a method 500 for removing halogen-containing residues described below with reference to FIG. 5, when executed by the CPU 138, transform the CPU 138 into a specific purpose computer (controller) 144. The software routines may also be stored and/or executed by a second controller (not shown) that is located remotely from the system 100.

Figure 2:
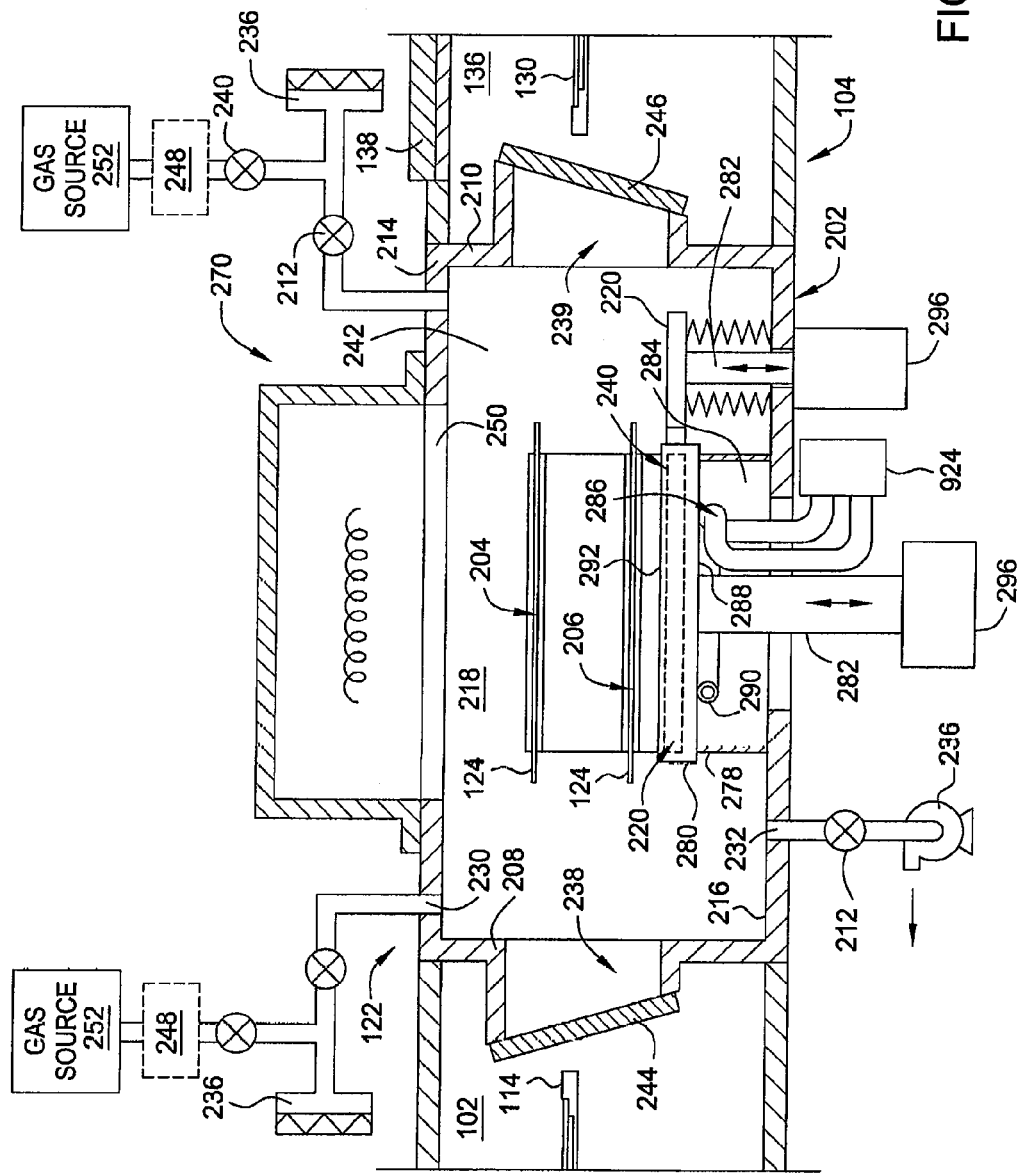
FIG. 2 depicts a sectional view of a load lock chamber utilized in FIG. 1.

FIG. 2 depicts one embodiment of the load lock chamber 122 utilized to perform a halogen-containing residue removal process. The load lock chamber 122 generally comprises a chamber body 202, a first substrate holder 204, a second substrate holder 206, a temperature control pedestal 240 and a heater module 270. The chamber body 202 may be fabricated from a singular body of material such as aluminum. The chamber body 202 includes a first side wall 208, a second side wall 210, lateral walls (242 in FIG. 3), a top 214 and a bottom 216 that define a chamber volume 218. A window 250 (shown in FIG. 4) typically comprised of quartz, is disposed in the top 214 of the chamber body 202 and is at least partially covered by the heater module 270.

The pressure of the chamber volume 218 may be controlled so that the load lock chamber 122 may be evacuated to substantially match the environment of the transfer chamber 136 and be vented to substantially match the environment of the factory interface 102. Additionally, the pressure of the chamber volume 218 may be controlled within a predetermined range that facilitates performing the halogen-containing residues removal process, as further described below. The chamber body 202 includes one or more vent passages 230 and a pump passage 232. The vent passage 230 and the pump passage 232 are positioned at opposite ends of the chamber body 202 to induce laminar flow within the chamber volume 218 during venting and evacuation to minimize particulate contamination. In one embodiment, two vent passages 230 are disposed through the top 214 of the chamber body 202, while the pump passage 232 is disposed through the bottom 216 of the chamber body 202. The passages 230, 232 typically are coupled to a valve 212 to selectively allow flow into and out of the chamber volume 218. Alternatively, the passages 230, 232 may be positioned at opposite ends of one of the chamber walls, or on opposing or adjacent walls. In one embodiment, the vent passage 230 is coupled to a high efficiency air filter 236 such as available from Camfil Farr, Inc., of Riverdale, N.J.

The vent passage 230 may be additionally coupled to a gas source 252 through a valve 240 to provide a gas mixture into the chamber volume 218. In one embodiment, the vent passage 230 may be configured as a gas distribution ring wherein the gas mixture may be distributed from adjacent the walls 210, 208 through an array of holes to optimize the flow uniformity. In another embodiment, the gas mixture may be supplied to the load lock chamber 202 through a gas distribution plate (not shown) disposed below the heater module 270. The gas distribution plate may be fabricated by a material transmissive to the heat generated from the heater module 270 such as not to substantially interfere with the heating of the substrates positioned on the substrate holders 204, 206, Examples of gases that may be supplied from the gas source 252 include nitrogen ($N_2$), argon (Ar), hydrogen ($H_2$), alkanes, alkenes, helium (He), oxygen ($O_2$), ozone ($O_3$), wafer vapor ($H_2O$), and the like.

In one embodiment, a remote plasma source (RPS) 248 may be alternatively coupled to the vent passage 230 to assist in removing the halogen-containing residues from the substrate surfaces. The remote plasma source 248 provides plasma formed from the gas mixture provided by the gas source 252 to the load lock chamber 122. In embodiment the remote plasma source (RPS) 248 is present, a diffuser (not shown) may be disposed at the outlet of the vent passage 230 to facilitate delivery the generated plasma into the load lock chamber 122.

The pump passage 232 is coupled to a point-of-use pump 236, such as available from Alcatel, headquartered in Paris, France. The point-of-use pump 236 has low vibration generation to minimize the disturbance of the substrate 124 positioned on the holders 204, 206 within the load lock chamber 122 while promoting pump-down efficiency and time by minimizing the fluid path between the load lock chamber 122 and pump 236 to generally less than three feet.

A first loading port 238 is disposed in the first wall 208 of the chamber body 202 to allow the substrate 124 to be transferred between the load lock chamber 122 and the factory interface 102. A first slit valve 244 selectively seals the first loading port 238 to isolate the load lock chamber 122 from the factory interface 102. A second loading port 239 is disposed in the second wall 210 of the chamber body 202 to allow the substrate 124 to be transferred between the load lock chamber 122 and the transfer chamber 136. A second slit valve 246 which is substantially similar to the first slit valve 244 selectively seals the second loading port 239 to isolate the load lock chamber 122 from the vacuum environment of the transfer chamber 136.

The first substrate holder 204 is concentrically coupled to (i.e., stacked on top of) the second substrate holder 206 that is disposed above the chamber bottom 216. The substrate holders 204, 206 are generally mounted to a hoop 220 that is coupled to a shaft 282 that extends through the bottom 216 of the chamber body 202. Typically, each substrate holder 204, 206 is configured to retain one substrate. The shaft 282 is coupled to a lift mechanism 296 disposed exterior to the load lock chamber 122 that controls the elevation of the substrate holders 204 and 206 within the chamber body 202. A bellows 284 is coupled between the hoop 220 and the bottom 216 of the chamber body 202 and disposed around the shaft 282 to provide a flexible seal between the second substrate holder 206 and the bottom 216, thus preventing leakage from or into the chamber body 202 and facilitating raising and lowing of the substrate holders 204, 206 without compromising the pressure within the load lock chamber 122.

The first substrate holder 204 is utilized to hold an unprocessed substrate from the factory interface 102 while the second substrate holder 206 is utilized to hold a processed substrate (e.g., an etched substrate) returning from the transfer chamber 136. The flow within the load lock chamber 122 during venting and evacuation is substantially laminar due to the position of the vent passage 230 and pump passage 232 and is configured to minimize particulate contamination.

Figure 3:
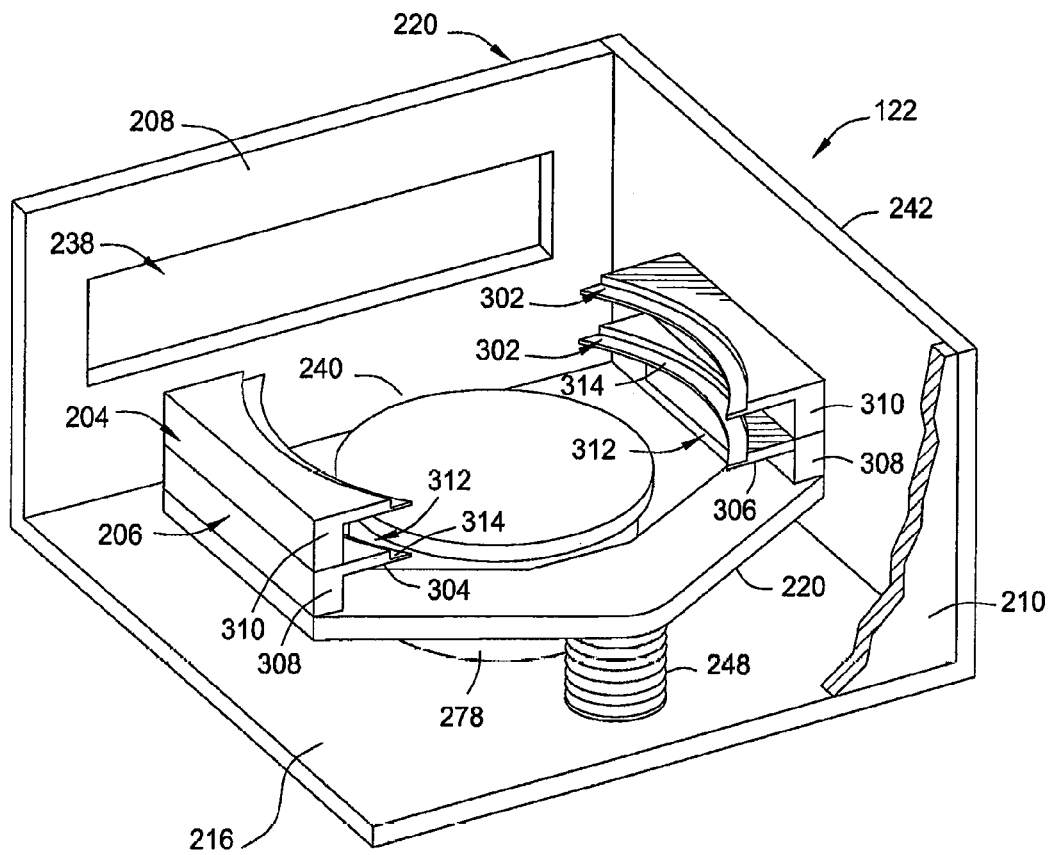
FIG. 3 depicts a sectional view of one embodiment of a heater module.

FIG. 3 depicts one embodiment of the substrate holders 204, 206 in the load lock chamber 122. The second substrate holder 206 is generally held above the bottom 216 of the chamber body 202 by the hoop 220. A first standoff 308 is disposed between each member 304, 306 to maintain the second substrate holder 206 in a spaced-apart relation to the hoop 220. A second standoff 310 is disposed between the first and second substrate holders 204, 206 to maintain a spaced-apart relation therebetween. The standoffs 308, 310 allow blades 134, 116 of the transfer and factory interface robots 130, 114 to pass therebetween when retrieving and depositing substrates on the substrate holders 204, 206. Each substrate holder 204, 206 includes a first member 304 and a second member 306. Each holder 204, 206 may have alternatively include a "L-shaped" configuration that incorporates a portion that maintains a spaced-apart relation between holder 204, 206 and adjacent components of the load lock chamber 122.

Each member 304, 306 includes a curved inner portion 312 that has a lip 314 extending radially inwards therefrom. The curved inner portion 312 is generally configured to allow the substrate 124 to pass therebetween and rest on the lip 314. The curved inner portion 312 captures the substrate 124 therebetween, thus preventing the substrate 124 from falling off the lip 314.

Referring back to FIG. 2, the temperature control pedestal 240 is coupled to the bottom 216 of the chamber body 202 by a support 278. The support 278 may be hollow or include passages therethrough to allow fluids, electrical signals, sensor and the like to be coupled to the pedestal 240. Alternatively, the pedestal 240 may be movably coupled to the chamber body 202 by a second shaft 232 and lift mechanism 296. In that embodiment, the support 278 may include a bellows 284.

The temperature control pedestal 240 generally includes a platen 280 which is generally fabricated from a thermally conductive material such as aluminum or stainless steel, but may alternatively be comprised of other materials, such as ceramic. The platen 280 generally has a heat transfer element 286. The heater transfer element 286 may be a fluid passage disposed in the platen 280 or disposed in contact with a lower surface 288 of the platen 280. Alternatively, the heat transfer element 286 may be a circulated water jacket, a thermoelectric device, such as a Peltier device, or other structure that may be utilized to control the temperature of the platen 280.

In one embodiment, the heat transfer element 286 comprises a tube 290 disposed in contact with the lower surface 288 of the platen 280. The tube 290 is coupled to a fluid source 294 that circulates a fluid through the tube. The fluid, for example, facility water from the fluid source 294, may optionally be thermally regulated. The tube 290 may be disposed in a substantially circular or spiral pattern against the lower surface 288 of the platen 280. Typically, the tube 290 is brazed to or clamped against the lower surface 288 or adhered using a conductive adhesive. Optionally, a conductive plate (not shown), such as a copper plate may alternatively be disposed between the tube 290 and platen 280 to promote uniformity of heat transfer across the width of the platen 280.

The hoop 220 having the substrate holders 204, 206 coupled thereto may be lowered to a first position where an upper surface 292 of the platen 280 is in close proximity or in contact with the substrate supported by the second substrate holder 206. In the first position, the platen 280 may be used to regulate the temperature of the substrate disposed on (or proximate to) the platen 280. For example, a substrate returning from processing may be cooled in the load lock chamber 122 by supporting the substrate during the evacuation of the load lock chamber 122 on the upper surface 292 of tho platen 280. Thermal energy is transferred from the substrate through the platen 280 to the heat transfer element 286, thereby cooling the substrate. After cooling the substrate, the substrate holders 204, 206 may be raised towards the top 214 of the chamber body 202 to allow the robots 130, 114 to access to the substrate seated in the second substrate support 206. Optionally, the holders 204, 206 may be lowered to a position where the upper surface 292 is in contact or close proximity to the substrate supported by the first substrate holder 204. In this position, the platen 280 may be used to thermally regulate and heat the substrate.

Figure 4:
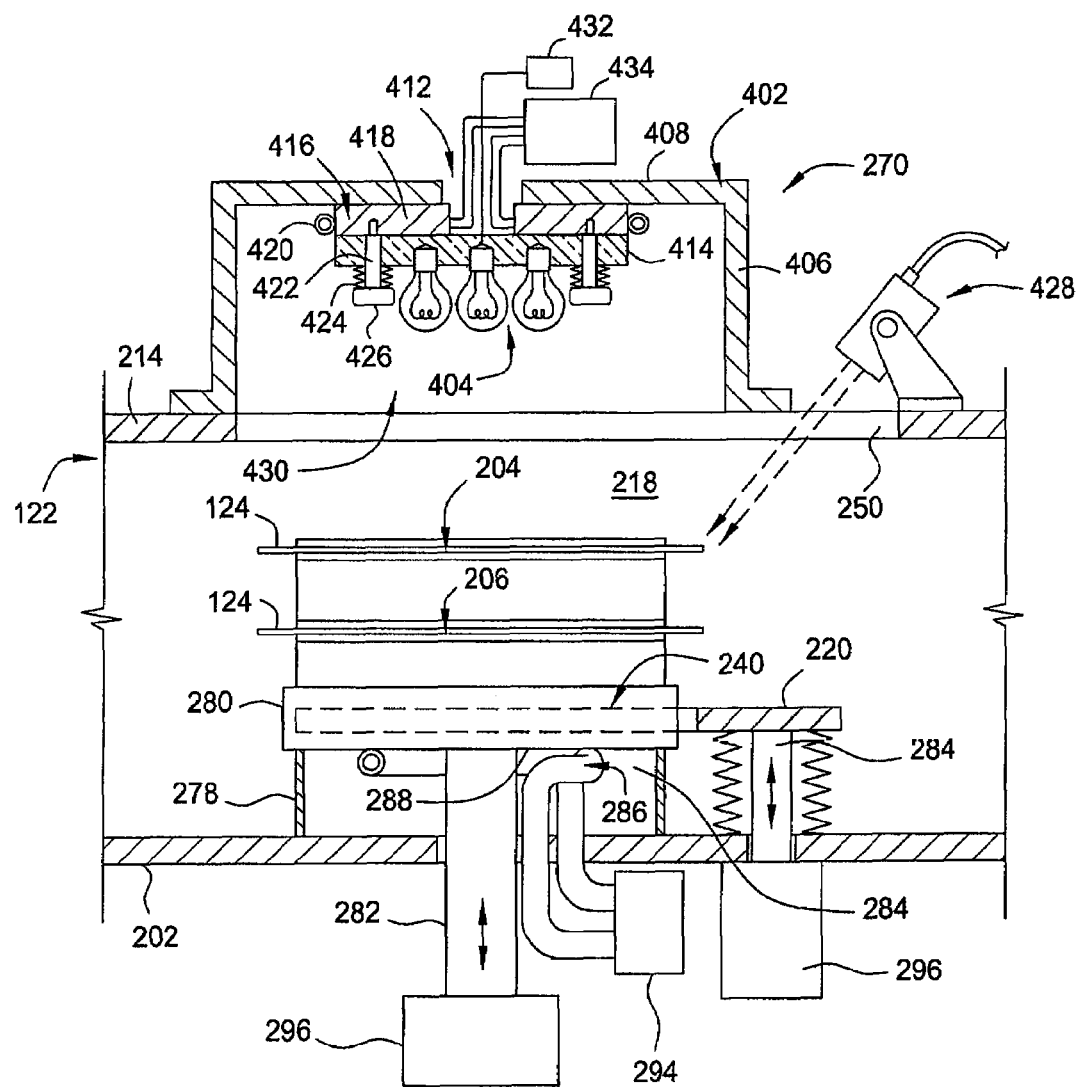
FIG. 4 depicts a sectional view of another embodiment of a load lock chamber.

FIG. 4 depicts a sectional view of one embodiment of the heater module 270. The heater module 270 is generally disposed on the top 214 of the load lock chamber 122. The heater module 270 may alternatively comprise various types of radiant heaters. In one embodiment, the heater module 270 includes a housing 402 having one or more lamps 404 disposed therein. The housing 402 generally includes sides 406 and a top 408 that define an interior 430. The sides 406 are generally coupled to the top of the chamber body 202. An aperture 412 is formed in the top 408 of the heater module 270 to facilitate power connection to the lamp 402. The lamp 402 is generally coupled to a power source 432 by a ceramic socket 414.

A cooling device 416 is coupled to the socket 414 to control the temperature of the lamps 404, thereby extending the life of the lamps 404. In one embodiment, the cooling device 416 is an annular plate 418 having good thermal conductivity that is thermally regulated by a circulating fluid. In one embodiment, the annular plate 418 is a copper disk having a tube 420 brazed to the perimeter of the plate 418. The fluid is circulated through the tube 420 from a fluid source 434, thereby regulating the temperature of the plate 418. Alternatively, the cooling device 416 may include thermoelectric devices, heat sinks, water jackets and other devices that limit the temperature rise of the socket 414.

The socket 414 is typically biased against the plate 418 to promote heat transfer therebetween. In one embodiment, a shoulder screw 422 is disposed through the socket 414 and plate 418 and threads into the top 408 of the housing 402. To accommodate thermal expansion between the socket 414 and plate 418, one or more springs 424 may be disposed between a head 426 of the shoulder screw 422 and the socket 414. The spring 424, which may be a coil, flat, belliville or other basising device, maintains contact between the socket 414 and plate 418 over a wide range of temperature without damaging the socket 414.

Optionally, a metrology device 428 may be disposed proximate the window 250. In one embodiment, the metrology device 428 may be a residual gas analyzer (RGA). The RGA detects the exhaust gases in the load lock chamber 122 and indicates the ions and species included in the exhaust gas released from the substrate surface. The released exhaust gas ions and species reflect the amount of halogen-containing residues remaining on the substrate surface, thereby determining an end point for the halogen-containing residue removal process. In another embodiment, the metrology device 428 may be other types of optical end point detection system that facilitates for determination of an end point for the halogen-containing residue removal process. Alternatively, the metrology device 428 may be a substrate type sensor, a substrate orientation sensor, a substrate center sensor, a substrate location sensor, a film thickness detector, a topography detector or other device utilized to detect attributes of the substrate disposed in the load lock chamber 122. Generally, the metrology device 428 is disposed proximate the heater module 270 and positioned to view the substrate through the window 250. Alternatively, the metrology device 428 may be disposed in the heater module 270 or in the chamber volume 218.

Referring back to FIG. 2, in operation, the load lock chamber 122 facilitates the transfer of substrates between the ambient atmosphere of the factory interface 102 and the vacuum atmosphere of the transfer chamber 136. The load lock chamber 122 temporarily houses the substrate while the atmosphere within the load lock chamber 122 is adjusted to match the atmosphere of the transfer chamber 136 or factory interface 102 into which the substrate is to be transferred. For example, the first slit valve 244 is opened while the load lock chamber 122 is vented to substantially atmospheric pressure to match the atmosphere of the factory interface 102. The factory interface robot 120 transfers an unprocessed substrate from one of the FOUP 106A-B to the first substrate holder 204. The substrate subsequently transfers to the processing chambers 110, 112, 132, 128, 120 to perform an etch process. After the halogen comprising etch process is completed, the pump passage 232 in the load lock chamber 122 is subsequently opened and the load lock chamber 122 is pumped down to the pressure substantially equal to the pressure of the transfer chamber 136. Once the pressures within the load lock 122 and transfer chamber 136 are substantially equal, the second slit valve 246 is opened. The processed substrate is transferred to position on the second substrate holder 206 by the transfer robot 130 in the load look chamber 122. The second slit valve 246 is closed once the blade of the transfer robot 130 is removed.

During halogen-containing residue removal process, the second substrate holder 206 may be raised the processed substrate toward the heater module 270 to increase heating efficiency, thereby converting the halogen-containing residues to non-volatile compounds that may be pumped out of the load lock chamber 122. During the removal process, one or more process gases may be supplied into the load lock chamber 122 to promote halogen removal as further discussed below. After the halogen-containing residues on the processed substrate surface has been partially or totally outgassed from the substrate surface, the vent passage 230 is opened in the load lock chamber 122 to allow the pressure in the load lock chamber 122 to raise to substantially match the pressure in the factory interface 102, thereby facilitating the processed substrate being transferred to the FOUPs 106A-B. While venting, the pedestal 240 is raised to contact the processed substrate rest on the second substrate holder 206. The processed substrate is thus cooled by transferring heat through the pedestal 240 to the fluid circulating in the tube 290. Once the pressures are matched, the first slit valve 244 is opened to allow the factory interface robot 114 to access the load lock chamber 122 to remove the processed substrate from the second substrate holder 206 and return to one of the FOUPs 106A-B. As such, as the substrate cooling process and the load lock chamber venting process is performed simultaneously, the overall process period and cycle time is reduced and productivity and throughput is increased. A newly unprocessed substrate from the FOUPs 106A-B may be transferred into the load lock chamber 122 on the first substrate holder 204 as the procossed substrate removed from the second substrate holder 206 by the factory interface robot 114 while the slit valve 244 the load lock chamber 122 remains opened.

After completion of the substrate transfer, the first slit valve 244 and vent passage 230 are closed. The pump passage 232 is subsequently opened and the load lock chamber 122 is pumped down to the pressure substantially equal to the pressure of the transfer chamber 136. Once the pressure of the load lock chamber 122 and the transfer chamber 136 are substantially equal, the second slit valve 246 is opened and the transfer robot 130 then retrieves the newly unprocessed substrate for position in the first substrate holder 204 for processing in one or more of the process chambers 110, 112, 132, 128, 120 circumscribing the transfer chamber 136 to repeatedly and consecutively perform the etch process and halogen-containing residue removal process as stated above. After substrate transfer is completed, the second slit valve 246 is closed to seal the load lock chamber 122 from the transfer chamber 136 as stated above.

Figure 5:
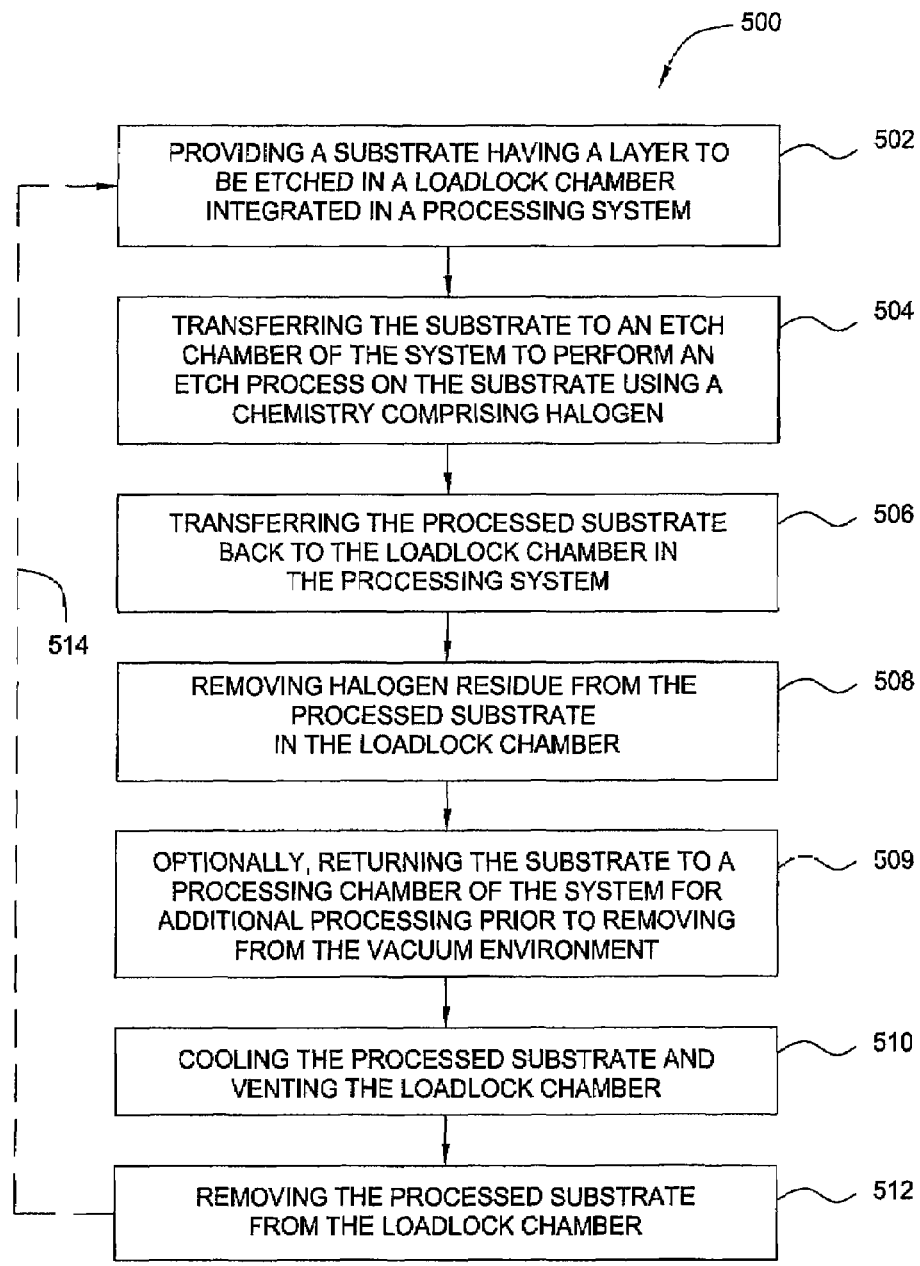
FIG. 5 depicts a process diagram illustrating a method for removing halogen-containing residues on a substrate according to one embodiment of the present invention.

FIG. 5 depicts a flow diagram of a method 500 for removing a halogen-containing residue from a substrate in accordance with the present invention. The method 500 is configured to perform at the processing apparatus 100 as described in FIG. 1. It is contemplated that the method 500 may be performed in other suitable processing systems, including those from other manufacturers.

The method 500 begins at step 502 by providing a substrate having a layer disposed thereon which is to be etched in the processing system 100. The factory interface robot 114 transfers the substrate to be processed from one of the FOUPs 106A-B to the first substrate holder 204 in the load lock chamber 122. The substrate may be any substrate or material surface upon which film processing is performed. In one embodiment, the substrate may have a layer or layers formed thereon utilized to form a structure, such as a gate structure. The substrate may alternatively utilize a mask layer as an etch mask and/or etch stop layer disposed on the substrate to promote the transfer of the features or structures to the substrate. In another embodiment, the substrate may have multiple layers, e.g., a film stack, utilized to form different patterns and/or features, such as dual damascene structure and the like. The substrate may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire, metal layers disposed on silicon and the like. The substrate may have various dimensions, such as 200 mm or 300 mm diameter wafers, as well as, rectangular or square panels.

In one embodiment, the substrate transferred to the load lock chamber 122 may be preheated to a predetermined temperature by the heater module 270 or by the temperature controlled pedestal 240 in the load lock chamber 122. In one embodiment, the substrate may be preheated to a temperature between about 20 degrees Celsius and about 400 degrees Celsius.

At step 504, after the pressure within the load lock chamber 122 and the transfer chamber 136 are substantially equal, the vacuum robot 130 transfers the substrate to one of the processing chambers 110, 112, 132, 128, 120. The substrate is etched in one of the processing chamber 110, 112, 132, 128, 120 to form desired features and patterns on the substrate. In embodiments which the substrate has mask layers disposed on the substrate surface, the etch process etches the mask layers simultaneously while forming the desired features and patterns.

In one embodiment, the substrate is etched in one of the processing chambers 110, 112, 132, 128, 120 by supplying a gas mixture having at least a halogen-containing gas. Suitable examples of halogen-containing gas include, but not limited to, hydrogen bromide (HBr), chlorine ($Cl_2$), carbon tetrafluoride ($CF_4$), and the like. In an exemplary embodiment suitable for etching polysilicon, the gas mixture supplied to the processing chamber 110, 112, 132, 128, 120 provides a gas mixture including hydrogen bromide (HBr) and chlorine ($Cl_2$) gas at a flow rate between about 20 sccm and about 300 sccm, such as between 20 sccm and about 60 sccm, for example about 40 sccm. The hydrogen bromide (HBr) and chlorine ($Cl_2$) gas may have a gas ratio ranging between about 1:0 and about 1:30, such as about 1:15. An inert gas may be supplied with the gas mixture to the processing chamber 110, 112, 132, 128, 120. Suitable examples of inert gas may include nitrogen ($N_2$), argon (Ar), helium (He) and the like. In one embodiment, the inert gas, such as $N_2$, may supplied with the gas mixture at a flow rate between about 0 sccm and about 200 sccm, such as between about 0 sccm and about 40 sccm, for example about 20 sccm. A reducing gas, such as carbon monoxide (CO) may be supplied with the gas mixture. The plasma power for the etch process may be maintained between about 200 Watts and about 3000 Watts, such as about 500 Watts and about 1500 Watts, for example about 1100 Watts, and the bias power may be maintained between about 0 Watts and about 300 Watts, such as about 0 Watts and about 80 Watts, for example about 20 Watts,. The process pressure may be controlled at between about 2 mTorr and about 100 mTorr, such as between about 2 mTorr and about 20 mTorr, for example about 4 mTorr, and the substrate temperature may be maintained at between about 0 degrees Celsius and about 200 degrees Celsius, such as between about 0 degrees Celsius and about 100 degrees Celsius, for example about 45 degrees Celsius.

During etching process, the etched materials may combine with the components of the etchant chemistry, as well as with the components of the mask layers, if any, and by-products of the etch process, thereby forming halogen-containing residues. In one embodiment, the materials on the substrate to be etched may include photoresist layer, hard mask layer, bottom anti-reflective coating (BARC), polysilicon, crystalline silicon, gate oxide, metal gate, such as Titanium nitride (TiN), and high-k materials, such as aluminum oxide ($Al_2O_3$), hafnium containing oxide. Suitable examples of hard mask layer include silicon nitride, TEOS, silicon oxide, amorphous carbon, and silicon carbide. The halogen-containing residues deposit on the surfaces of the substrate. The halogen-containing residue may release (e.g., outgas) gaseous reactants, such as bromine($Br_2$), chlorine($Cl_2$), hydrogen chloride (HCl), hydrogen bromine (HBr) and the like, if exposed to atmospheric pressures and/or water vapor. The release of such reactants may cause corrosions and particle contamination of the processing apparatus and factory interfaces during substrate transfer, such as the vacuum-tight processing platform 104 and the factory interface 102 as described in FIG. 1. In embodiments where metallic layers, such as Cu, Al, W, are exposed to the substrate surface, the metallic layer may be corroded by the released gaseous reactants if they are not removed by the inventive process described below, thereby adversely deteriorating the performance of devices formed on the substrate.

Halogens may also be present on tho surface of substrates that are processed in a vacuum environment in a manner other than etching. Therefore, It is contemplated that halogens may be removed from those substrates using the method and apparatus described herein.

At step 506, the processed (e.g., etched) substrate is transferred to the load lock chamber 122 to remove the halogen-containing residues from the substrate generated during step 504 prior to exposure to atmospheric conditions or water vapor in the factory interface or other location. After etch processing, the vacuum robot 130 in the transfer chamber 136 transfers the etched substrate from one of the processing chambers 110, 112, 132, 128, 120 to the second substrate holder 206 in the load lock chamber 122.

At step 508, a thermal treatment process is performed on the etched substrate to remove the halogen-containing residues on the etched substrate surface. The etched substrate held by the second substrate holder 206 raises the substrate 124 toward the heater module 270, thereby increasing the intensity of heat transfer to the substrate. The heat from the heater module 270 causes the temperature of the surface of the substrate to rise, thereby causing halogen-based reactants disposed on the etched substrate surface to be released and/or outgassed. The heater module 270 heats the substrate to a temperature between about 20 degrees Celsius and about 400 degrees Celsius, such as between about 150 degrees Celsius and about 300 degrees Celsius, for example about 250 degrees Celsius, at between about 5 seconds and about 30 seconds. The rapid heating of the substrate by heater module 270 allows the halogen-containing residues on the etched substrate to be removed without increasing process cycle time which would be encountered if the residues were removed in one if the processing chambers. In one embodiment, the substrate may be heated by the heater module 270 at a predetermined time period until the halogen-containing residues on the etched substrate are removed therefrom. The time or endpoint may be determined using the metrology device 428. The etched substrate may be heated at a temperature between about 150 degrees Celsius and about 300 degrees Celsius, such as 250 degrees Celsius for between about 10 seconds to about 120 seconds, such as between about 30 seconds to about 90 seconds.

In one embodiment, a gas mixture may be supplied from the gas source 252 to the load lock chamber 122 while heating the etched substrate. The etched substrate is exposed to and reacts with the gas mixture. The gas mixture converts the outgassed halogen-based reactants into non-corrosive volatile compounds that are pumped out of the load lock chamber 122. The gas mixture may include an oxygen-containing gas, such as $O_2$, $O_3$, water vapor ($H_2O$), a hydrogen-containing gas, such as $H_2$, forming gas, water vapor ($H_2O$), alkanes, alkenes, and the like, or an inert gas, such as a nitrogen gas ($N_2$), argon (Ar), helium (He), and the like. For example, the gas mixture may include oxygen, nitrogen, and a hydrogen-containing gas. In one embodiment, the hydrogen-containing gas is at least one of hydrogen ($H_2$) and water vapor ($H_2O$). In embodiments which mask layers is present on the substrate, the mask layers may be simultaneously removed with the halogen-containing residues, e.g., the mask is stripped of the photoresist in the load lock chamber.

In one embodiment, the gas mixture may be supplied at a flow rate between about 100 sccm and about 5000 sccm, such as between about 200 sccm and about 1000 sccm, for example about 300 sccm. Alternatively, the gas mixture, for example, may be an $O_2$ and $N_2$ gas mixture supplied at a gas ratio between about 1:1 and about 20:1, such as between about 10:1. The pressure of the load lock chamber 122 may be maintained at between about 10 mTorr and about 5000 mTorr, such as, between about 100 mTorr and about 1000 mTorr, for example, about 300 mTorr. In embodiments where the halogen-containing residues are mostly chlorine-based residues resulting from use of chlorine-based etching chemistry, the gas mixture may be oxygen gas ($O_2$) and/or hydrogen containing gas, such as water vapor ($H_2O$) and/or $H_2$. The oxygen gas ($O_2$) may be supplied at a flow rate at between about 100 sccm and about 5000 sccm and hydrogen containing gas, such as water vapor ($H_2O$) and/or $H_2$ may be supplied at a flow rate at between about 100 sccm and about 3000 sccm. Alternatively, the oxygen gas ($O_2$) and hydrogen containing gas, such as water vapor ($H_2O$) and/or $H_2$, may be supplied at a ratio between about 200:1 and about 1:1, such as about 150:1 and about 5:1. Alternatively, the gas mixture may be an oxygen gas or a pure hydrogen containing gas, such as water vapor ($H_2O$). A residual gas analyzer (RGA), such as the metrology device 428 as described in FIG. 4, may be utilized to detect the remaining halogen-containing residues on the etched substrate surface.

In an alternative embodiment, the gas mixture may be provided to the interior of the load lock chamber 122 through a remote plasma source, such as the remote plasma source 248 in FIG. 2. The remote plasma source ionizes the gas mixture. The dissociated ions and species promote the conversion of the outgassed halogen-based reactants into non-corrosive volatile compounds, thereby increasing the removal efficiency of the halogen-containing residues from the etched substrate surface. In one embodiment, the remote plasma source may provide a plasma power at between about 500 Watts and 6000 Watts. In embodiments Where the plasma is present, an inert gas, such as Ar, He or $N_2$, may be supplied with the gas mixture.

Optionally, a step 509 may be performed wherein the substrate is returned to one of the processing chamber 110, 112, 132, 128, 120 of the system for additional processing prior to removing from the vacuum environment. The substrate, after the halogen removal process of step 508, will not introduce halogens into the processing chambers during subsequent processing, thereby preventing damage to the processing chambers.

At step 510, the temperature control pedestal 240 is raised to contact the etched substrate supported on the second substrate holder 206 after the halogen residue removal step 508 to cool the substrate to a desired temperature. The etched substrate is cooled by transferring heat through the pedestal 240 to the fluid circulating in the tube 290. In one embodiment, the etched substrate may be cooled to a temperature ranging between about 10 degrees Celsius and about 125 degrees Celsius that allows the etched substrate returning to the FOUPs 106A-B without causing damage to the FOUPs 106A-B.

While cooling the substrate at step 510, the load lock chamber 122 may be simultaneously vented in preparation for the subsequent substrate transfer process at step 512 to minimize process cycle time. Once the pressures of the load lock chamber 122 and the factory interface 102 are matched, the first slit valve 244 is opened to allow the factory interface robot 114 to access the load lock chamber 122 to remove the etched substrate from the load lock chamber 122 and return to one of the FOUPs 106A-B. A newly unprocessed substrate from the FOUPs 106A-B may be transferred into the load lock chamber 122 on the first substrate holder 204 while the etched substrate is removed from the second substrate holder 206, thereby repeatedly and consecutively processing substrates as indicated by the loop 514 depicted in FIG. 5.

Thus, the present invention provides a method and apparatus for removing halogen and/or halogen-containing residues on a substrate. The method and apparatus advantageously prevents substrate contamination and corrosion of exposed portions of metallic films deposited on the substrate, along with preventing contamination and corrosion of the processing system from by released halogens, thereby enhancing productivity and process throughput.

While the foregoing is directed to embodiments of the present invention, other and further embodiments of the invention may be devised without departing from the basic scope thereof, and the scope thereof is determined by the claims that follow.

The invention claimed is:

1. A method for removing volatile residues from a substrate, comprising:
   providing a processing system having a load lock chamber and at least one processing chamber coupled to a transfer chamber, wherein the load lock chamber is configured to transfer a substrate from an ambient environment outside the processing system to a vacuum environment inside the transfer chamber;
   treating a substrate in the processing chamber with a chemistry comprising halogen; and
   removing volatile residues from the treated substrate in the load lock chamber.

2. The method of claim 1, wherein the volatile residues are halogen-containing residues.

3. The method of claim 1, wherein the step of removing the volatile residues from the treated substrate further comprises:
   heating the treated substrate to a temperature between about 20 degrees Celsius and about 400 degrees Celsius.

4. The method of claim 1, wherein the step of removing volatile residues from the substrate further comprises:
   exposing the treated substrate to a gas mixture in the load lock chamber prior to venting the load lock chamber.

5. The method of claim 4, wherein the gas mixture comprises at least one of $O_2$, $O_3$, water vapor ($H_2O$), $H_2$, alkanes, alkenes and nitrogen gas ($N_2$).

6. The method of claim 4, wherein the gas mixture comprises at least one of nitrogen gas ($N_2$), argon (Ar) and helium (He).

7. The method of claim 4, wherein the step of exposing the treated substrate to the gas mixture further comprises:
   supplying the gas mixture at a flow rate between about 500 sccm and about 5000 sccm.

8. The method of claim 4, wherein the gas mixture comprises an $O_2$ to $N_2$ ratio between about 1:1 and about 1:20.

9. The method of claim 4, wherein the step of exposing the treated substrate further comprises:
   exposing the treated substrate to the gas mixture between about 10 seconds to about 120 seconds.

10. The method of claim 4, wherein the gas mixture further comprises $O_2$ and water vapor ($H_2O$) or $H_2$, and wherein the chemistry further comprises chlorine.

11. The method of claim 1, wherein the step of removing the volatile residues further comprises:
    maintaining the load lock chamber at a pressure at between about 10 mTorr and about 5000 mTorr.

12. The method of claim 1, wherein the step of removing volatile residues from the treated substrate further comprises:
    exposing the treated substrate to a plasma in the load lock chamber.

13. The method of claim 12, wherein the step of exposing the treated substrate to the plasma further comprises:
    forming the plasma in a remote plasma source.

14. The method of claim 12, wherein the plasma is formed from at least one of $O_2$, $O_3$, water vapor ($H_2O$), $H_2$, alkanes, alkenes, and nitrogen gas ($N_2$) and wherein the plasma further comprises at least one of argon (Ar) and helium (He).

15. The method of claim 13, wherein the step of forming the plasma further comprises:
    maintaining a plasma power at between about 500 Watts and 6000 Watts.

16. The method of claim 12, wherein the step of forming the plasma further comprises:
    supplying a gas mixture at a flow rate between about 500 sccm and about 5000 sccm.

17. The method of claim 1 further comprising:
    cooling the treated substrate in the load lock chamber after the volatile residues removal step; and
    removing the substrate from the load lock chamber.

18. The method of claim 17, wherein the step of removing the volatile residues from the treated substrate further comprises:
    detecting an end point of the removing step in the load lock chamber; and
    transferring the substrate back into the transfer chamber.

19. The method of claim 1, wherein the step of treating the substrate further comprising:
    treating the substrate using at least one of hydrogen bromide (HBr), chlorine ($Cl_2$), and carbon tetrafluoride ($CF_4$).

20. A method for removing halogen-containing residues from a substrate, comprising:
    providing a processing system having a load lock chamber and at least one processing chamber coupled to a transfer chamber, wherein the load lock chamber is configured to transfer a substrate from an ambient environment outside the processing system to a vacuum environment inside the transfer chamber;
    etching a substrate in the processing chamber with chemistry comprising halogen;
    removing halogen-containing residues from the etched substrate in the load lock chamber;
    cooling the substrate in the load lock chamber after the residue removing step; and
    removing the cooled substrate from the load lock chamber.

21. The method of claim 20, wherein the step of removing halogen-containing residues further comprises:
    supplying a gas mixture comprising at least one of $O_2$, $O_3$, water vapor ($H_2O$), $H_2$, alkanes, alkenes, and nitrogen gas ($N_2$) prior to venting the load lock chamber.

22. The method of 20, wherein the step of removing halogen-containing residues further comprises:
    supplying a gas mixture comprising at least one of nitrogen gas ($N_2$), argon (Ar) and helium (He) prior to venting the load lock chamber.

23. The method of claim 20, wherein the step of removing halogen-containing residues further comprises:
    heating the etched substrate to a temperature between about 20 degrees Celsius and about 400 degrees Celsius; and
    maintaining a pressure of the load lock chamber at between about 10 mTorr and about 5000 mTorr.

24. The method of claim 20, wherein the step of removing halogen-containing residues further comprises:
    exposing the etched substrate to a plasma in the load lock chamber.

25. The method of claim 24, wherein the step of exposing the substrate to the plasma further comprises:
    forming the plasma by a remote plasma source.

26. The method of claim 24, wherein the plasma is formed from at least one of $O_2$, $O_3$, water vapor ($H_2O$), $H_2$, alkanes, alkenes, and wherein the plasma further comprises at least one of nitrogen gas ($N_2$), argon (Ar) and helium (He).

* * * * *

UNITED STATES PATENT AND TRADEMARK OFFICE
CERTIFICATE OF CORRECTION

PATENT NO. : 7,655,571 B2 Page 1 of 1
APPLICATION NO. : 11/553132
DATED : February 2, 2010
INVENTOR(S) : Kawaguchi et al.

It is certified that error appears in the above-identified patent and that said Letters Patent is hereby corrected as shown below:

Title Page, Item (75) Inventors:
Please delete "Steven M. Kim" and insert --Steven H. Kim-- therefor;

In the Summary of the Invention:
Column 2, Line 2, please delete "procossing" and insert --processing-- therefor;

In the Detailed Description:
Column 7, Line 5, please delete "tho" and insert --the-- therefor;
Column 7, Line 44, please delete "scrow" and insert --screw-- therefor;
Column 8, Line 32, please delete "look" and insert --lock-- therefor;
Column 8, Line 64, please delete "procossed" and insert --processed-- therefor;
Column 10, Line 61, please delete "tho" and insert --the-- therefor;
Column 12, Line 24, please delete "Where" and insert --where-- therefor.

Signed and Sealed this

Twentieth Day of April, 2010

David J. Kappos
*Director of the United States Patent and Trademark Office*